United States Patent [19]
Egawa

[11] Patent Number: 6,118,145
[45] Date of Patent: Sep. 12, 2000

[54] SEMICONDUCTOR DEVICE AND MANUFACTURING METHOD THEREOF

[75] Inventor: Yuichi Egawa, Tokyo, Japan

[73] Assignee: Nippon Steel Corporation, Tokyo, Japan

[21] Appl. No.: 09/100,967

[22] Filed: Jun. 22, 1998

[30]   Foreign Application Priority Data

Jun. 27, 1997  [JP]  Japan .................................. 9-187517
Apr. 14, 1998  [JP]  Japan ................................. 10-120152

[51] Int. Cl.⁷ ............................................... H01L 27/108
[52] U.S. Cl. ........................... 257/296; 257/300; 257/306
[58] Field of Search ................................. 257/296, 300, 257/787, 306

[56]   References Cited

U.S. PATENT DOCUMENTS 5,136,533  8/1992  Harari .
5,399,890  3/1995  Okada et al. .
5,519,237  5/1996  Itoh et al. .
5,557,566  9/1996  Ochii .

FOREIGN PATENT DOCUMENTS 5-136132  5/1993  Japan .
B-6-80667  6/1994  Japan .
7-153849  6/1995  Japan .
9-51038   2/1997  Japan .

*Primary Examiner*—Stephen D. Meier
*Attorney, Agent, or Firm*—Pollock, Vande Sande & Amernick

[57]   ABSTRACT

A semiconductor device with a reduced slope between components, and a method of manufacturing a semiconductor device, represented by DRAM, having a large difference of level between components, for planarizing an inter-layer insulating film covering respective components in accordance with a design to precisely reduce a slope of the inter-layer insulating film over the difference in level between components, without increasing the number of manufacturing steps or introducing complicated manufacturing steps. Each storage node electrode connected to a source is formed, and an electrically isolated dummy pattern is simultaneously formed on an inter-layer insulating film. Then, a BPSG film is formed and reflowed, followed by etching back the surface of the BPSG film. Subsequently, the dummy pattern is used as an index for indicating the end of the etch back, and the BPSG film is etched back until a portion of a cell plate electrode covering the dummy pattern is exposed.

22 Claims, 13 Drawing Sheets

PERIPHERAL TRANSISTOR REGION | MEMORY CELL REGION

PERIPHERAL TRANSISTOR REGION | MEMORY CELL REGION

SEMICONDUCTOR DEVICE AND MANUFACTURING METHOD THEREOF

BACKGROUND OF THE INVENTION

1. Field of the Invention

The present invention relates to a semiconductor device and a manufacturing method thereof particularly suitable for application in semiconductor memories such as DRAM and so on which comprise memory cells each including a selecting transistor and a memory capacitor.

2. Description of the Related Art

Generally, a memory cell in DRAM includes a selecting transistor having a gate, a drain and a source, and a memory capacitor having a storage node electrode connected to the source and a cell plate electrode opposing the storage node electrode through a dielectric film formed therebetween. In the DRAM constructed with the components as mentioned above, a larger surface area must be provided for the storage node electrode in order to ensure the capacitance of the memory capacitor, thereby causing necessarily a larger difference of level or height between a memory cell region and a peripheral circuit region.

To reduce the difference of level or height due to the memory capacitor, a BPSG (Boro-Phospho Silicate Glass) film, for example, is formed as an inter-layer insulating film for covering the selecting transistor and the memory capacitor after the cell plate electrode is formed. Then, this BPSG film is reflowed, and the entire surface of the BPSG film is etched back for planarization of the surface. In this processing, an end point of the etch back is determined by detecting an exposed portion of the cell plate electrode which is a top polycrystalline silicon film within the BPSG film. Subsequently, an insulating film is formed over the BPSG film to cover the exposed portion of the cell plate electrode, and then a variety of wiring films are patterned on the insulating film which has a planarized surface.

As described above, since the conventional level difference reducing method for DRAM utilizes the cell plate electrode as a stopper for the etch back, the formation of an insulating film for again covering the exposed cell plate electrode is indispensable, thus causing an increase in the number and complexity of manufacturing steps.

JP-A-7-153849 discloses an approach for reducing a difference of level in a DRAM structure. Specifically, during the manufacturing of a DRAM, a polysilicon film for dummy pattern is formed around the outer periphery of a plurality of storage node electrodes formed adjacent to each other, such that the polysilicon film for dummy pattern reduces a slope of a surface of the DRAM overlying contact holes formed in close proximity to the storage node electrodes positioned along the outer edges to reduce the difference of level.

JP-A-5-136132 discloses another approach for reducing a difference of level in a DRAM structure, wherein a first dummy layer is formed simultaneously with gate electrodes, and a second dummy layer is formed simultaneously with storage node electrodes in an area inside of the first dummy layer, during the manufacturing of a DRAM, to reduce a slope of an end surface over memory capacitors, thereby reducing the difference of level.

The approaches disclosed in JP-A-7-153849 and 5-136132, however, involve the formation of an inter-layer insulating film to bury dummy patterns thereinto, so that even although these approaches may contribute to a reduced slope, it seems to be difficult to provide sufficient planarity for the surface of the inter-layer insulating film. If sufficient planarity is not ensured for the surface of the inter-layer insulating film, halation will occur when a wiring film is patterned on the inter-layer insulating film, resulting in thinner portions in the wiring film.

JP-B-6-80667, though not directed to semiconductor devices represented by DRAM having a large difference of level between components nor intended to reduce a slope of an inter-layer insulating film over a difference of level in a device, discloses a method of forming a plurality of connection structures for simultaneously forming respective wires for connection with diffusion layers and gate electrodes on a semiconductor substrate having a rugged surface.

However, since this manufacturing method utilizes a wire located at a higher level as a stopper for etch back, the formation of an insulating film is indispensable for again covering exposed wires, in a manner similar to the aforementioned prior art example.

JP-A-9-51038 discloses the formation of a patterned polysilicon, a nitride film and so on over a redundant fuse portion through an oxide film, with the polysilicon used as a stopper for etching the nitride film or the like overlying the redundant fuse portion. Here, the redundant fuse refers to a wire which will be cut for replacing a defective memory cell with a normal memory cell, and an insulating film must be left exclusively on the redundant fuse in a thickness of approximately 200 nm to 400 nm. For this reason, the patterned polysilicon is etched away to its bottom, so that the oxide film is exposed.

However, since this manufacturing method involves forming the polysilicon pattern approximately 200 nm to 400 nm above the redundant fuse, the surfaces of the nitride film or the like cannot be planarized.

SUMMARY OF THE INVENTION

It is therefore a first object of the present invention to planarize an inter-layer insulating film for covering respective components formed on a semiconductor substrate in a semiconductor device such as DRAM, typically having a large level difference between the components, in accordance with a design, to reduce a slope of the inter-layer insulating film over the difference in level between the components, without causing an increase in the number of steps or introducing complicated steps.

As an inter-layer insulating film is formed thicker for planarization, this must be etched back, wherein variations in process however cannot be absorbed only with adjustments of etching time. It is therefore a second object of the present invention to facilitate the detection of an end point of etch back by including an end point index indicative of an etch-back end point within a semiconductor device.

To achieve the above objects, a semiconductor device having a memory cell region and a peripheral transistor region, according to the present invention, comprises a semiconductor substrate, a plurality of semiconductor elements having multiple conductive films stacked on the semiconductor substrate through an insulating film in the memory cell region, a dummy pattern including at least one layer of conductive film, wherein the dummy pattern is formed in the memory cell region at a position closer to the peripheral transistor region than one of the plurality of semiconductor elements adjacent to the peripheral transistor region, an inter-layer insulating film covering the plurality of semiconductor elements and the dummy pattern and having a sloping area between the memory cell region and the peripheral transistor region, wherein a portion of the dummy pattern protrudes from a surface of the inter-layer insulating film, and a wiring layer formed on the inter-layer insulating film and including a conductive film electrically connected to the at least one layer of conductive film of the dummy pattern.

Also, according to the present invention, a method of manufacturing a semiconductor device including a plurality of selecting transistors and a plurality of memory capacitors electrically connected to the selecting transistors in a memory cell region and including a plurality of peripheral transistors in a peripheral transistor region, comprises a first step of forming gate electrodes of the plurality of selecting transistors and gate electrodes of the plurality of peripheral transistors overlying a semiconductor substrate through an insulating film, a second step of forming a plurality of draw-out electrodes electrically connected to portions of the semiconductor substrate functioning as sources and drains, a third step of forming lower electrodes of the plurality of memory capacitors on the plurality of draw-out electrodes electrically connected to the sources of the selecting transistors, and simultaneously forming a conductive film as a portion of a dummy pattern, a fourth step of forming a dielectric film for the capacitors to cover the lower electrodes, a fifth step of forming a conductive film to cover the dielectric film and machining the conductive film to form upper electrodes of the capacitors, a sixth step of forming an inter-layer insulating film to cover the upper electrodes, and a seventh step of removing a superficial layer of the inter-layer insulating film until a portion of the dummy pattern is exposed, to planarize a surface of the inter-layer insulating film.

In the present invention, a dummy pattern is formed together with a conductive film, which is a component of a semiconductor device, for example, lower electrodes (storage node electrodes) in a DRAM, at the same hierarchical level as the conductive film. Since the dummy pattern is formed together with a predetermined conductive film, it can be readily formed without increasing the number of manufacturing steps. Then, a superficial layer of an inter-layer insulating film is removed until a portion of the dummy pattern or a portion of a conductive film covering the dummy pattern, for example, an upper electrode (cell plate electrode) is exposed. In this event, the dummy pattern serves as an index to form a planar inter-layer insulating film having a precisely reduced slope over a difference in level between components in accordance with a design. Since the dummy pattern does not function as a conductive film, which is a component of the semiconductor device (a storage node electrode in the foregoing example), a variety of wiring films may be formed precisely on the planar inter-layer insulating film without taking into account possible short-circuiting.

Here, it is also preferable to form a wiring film to be actively connected with the dummy pattern. In this case, the wiring film can contribute to a more reduced slope near the dummy pattern as well as serve to fix the potential at the conductive film covering the dummy pattern (a cell plate electrode in the foregoing example).

DESCRIPTION OF THE PREFERRED EMBODIMENTS

Several preferred embodiments of the present invention will hereinafter be described in detail with reference to the accompanying drawings.

(First Embodiment)

First, a first embodiment will be described with reference to FIGS. 1A to 1H and 2A to 2C. In the first embodiment, a useful DRAM is illustrated as a semiconductor memory, and the configuration of this DRAM will be described along with a manufacturing method thereof. The DRAM includes a plurality of memory cells and a plurality of peripheral transistors for controlling these memory cells. FIGS. 1A to 1H are schematic cross-sectional views which illustrate in order various steps in the method of manufacturing the DRAM according to the first embodiment. FIGS. 2A to 2C are schematic plan views which only illustrate memory capacitors and a dummy pattern, where FIGS. 1A to 1H correspond to cross-sections taken along one-dot chain lines A-A' in FIGS. 2A to 2C.

Figure 1A:
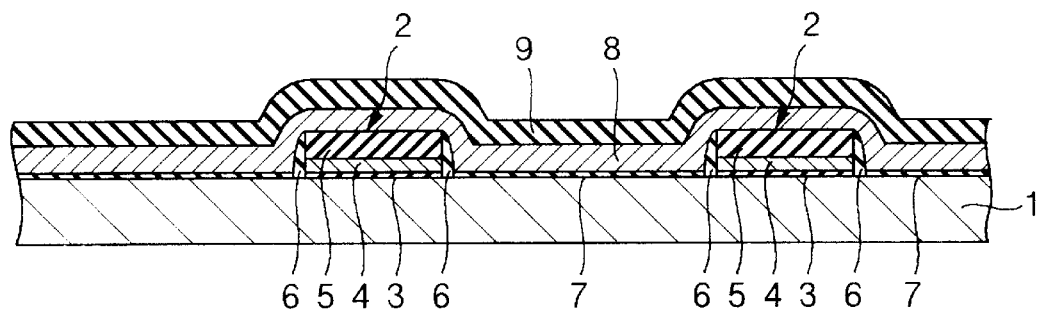
FIGS. 1A to 1H are cross-sectional views illustrating in order various steps in a method of manufacturing a semiconductor device according to a first embodiment of the present invention.
Figure 2A:
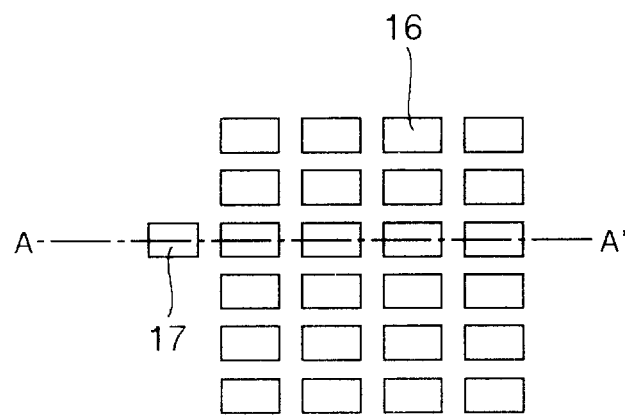
FIGS. 2A to 2C are plan views illustrating in order several steps in the method of manufacturing a semiconductor device according to the first embodiment of the present invention.
Figure 2B:
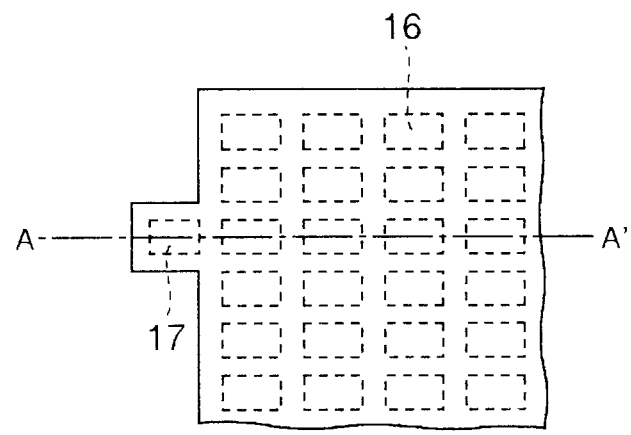
Figure 2C:
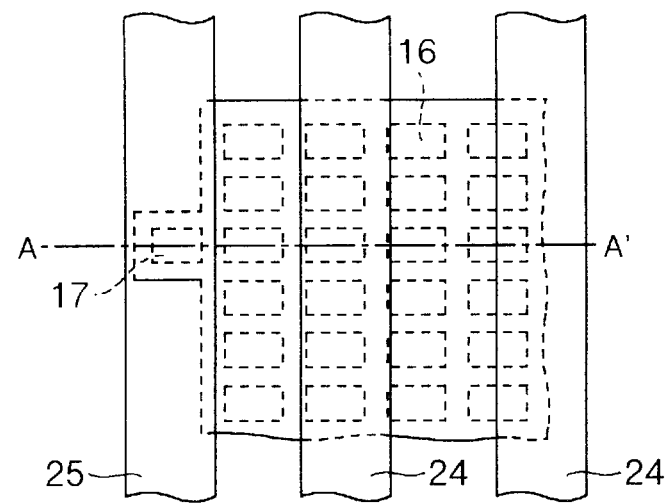

Referring first to FIG. 1A, element separating structures each for defining an element active region, field shield element separating structures 2 in this embodiment, is formed on a p-type silicon semiconductor substrate 1.

Specifically, a surface of the silicon semiconductor device 1 is thermally oxidized to form a thin shield gate oxide film 3, and a polycrystalline silicon film 4 is deposited on the shield gate oxide film 3 by a low pressure CVD method. In this event, for improving the conductivity of the polycrystalline silicon film 4, an undoped polycrystalline silicon film is formed while a $PH_3$ gas is introduced during the formation of the film to add phosphorus (P) thereto. Alternatively, phosphorus may be added by ion implantation after an undoped polycrystalline silicon film is previously formed. Subsequently, a silicon oxide film 5 is deposited on the polycrystalline silicon film 4 by a low pressure CVD method or the like.

Next, the silicon oxide film 5, the polycrystalline silicon film 4 and the shield gate oxide film 3 are subjected to photolithography and subsequent dry etching to pattern these films into element separating structures 2. In this event, the surface of the silicon semiconductor substrate 1 remains exposed in element active regions except for their sites at which the element separating structures 2 have been formed. Then, a silicon oxide film is formed over the entire surface, and anisotropic dry etching is performed on the entire surface of the silicon oxide film to leave the silicon oxide film only on side surfaces of the silicon oxide film 5, the polycrystalline silicon film 4 as shield plate electrodes, and the shield gate oxide film 3 to form side walls 6, thus completing the field shield element separating structures 2 which surround element active regions in which memory cells are formed.

Alternatively, the element separating structures may be implemented by an insulating film, in place of the field shield element separating structures 2. Such insulating film for element separation may be provided by forming a field oxide film on the silicon semiconductor substrate 1 by a LOCOS (Local Oxidation of Silicon) method, or by forming grooves in element separating regions of the silicon semiconductor substrate 1 and filling the groove with, for example, a silicon oxide film.

Next, the surface of the silicon semiconductor substrate 1 in the element active regions is thermally oxidized to form a thin gate oxide film 7, and a polycrystalline silicon film 8 as field shield electrodes is deposited over the entire surface including the field shield element separating structures 2 by a low pressure CVD method. In this event, for improving the conductivity of the polycrystalline silicon film 8, an undoped polycrystalline silicon film is formed while a $PH_3$ gas is introduced during the formation of the film to add phosphorus (P) thereto. Subsequently, a silicon oxide film 9 is deposited over the polycrystalline silicon oxide film 8 by a low pressure CVD method or the like.

Figure 1B:
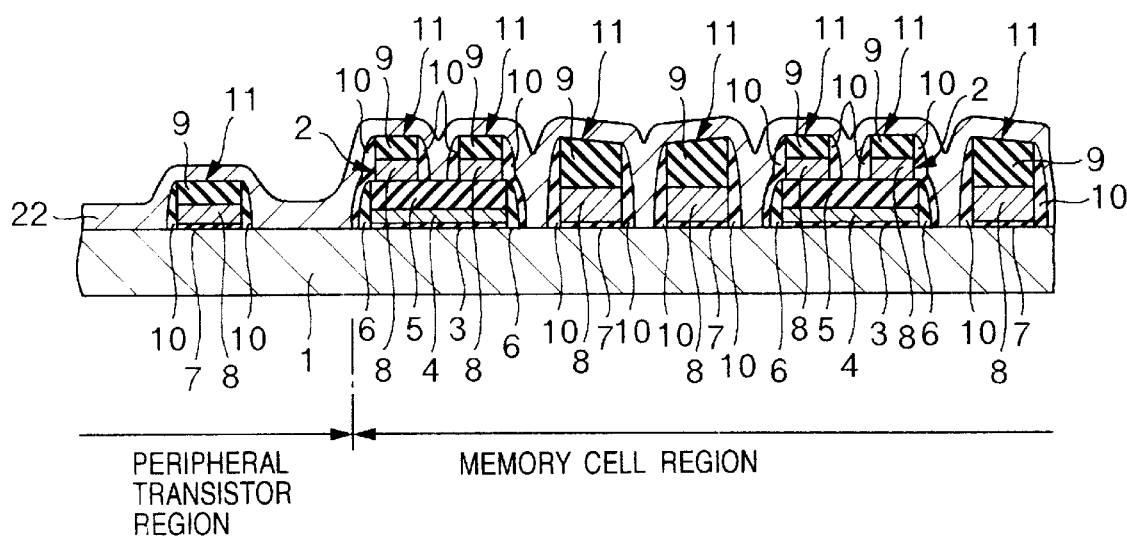

Next, as illustrated in FIG. 1B, in a memory cell region and a peripheral transistor region, the silicon oxide film 9, the polycrystalline silicon film 8 and the gate oxide film 7 are subjected to photolithography and subsequent dry etching to pattern these films into electrodes which extend over the element active regions and the field shield element separating structures 2. In this event, the surface of the silicon semiconductor substrate 1 remains exposed in the element active regions except for sites at which the films 7, 8, 9 are formed into electrodes. Subsequently, a silicon oxide film is formed over the entire surface, and anisotropic dry etching is performed over the entire surface of this silicon oxide film to leave the silicon oxide film only on side surfaces of the silicon oxide films 9, the polycrystalline silicon films 8, the gate oxide films 7 and the side walls 6 to form side walls 10, thus completing electrode structures 11. In each electrode structure 11, the patterned polycrystalline silicon film 8 is formed into a gate electrode and also functions as a word line in each element active region within the memory cell region.

Subsequently, a polycrystalline silicon film 22 is formed by a low pressure CVD method so as to fill spaces between adjacent electrode structures 11 in the element active regions. In this event, for improving the conductivity of the polycrystalline silicon film, an undoped polycrystalline silicon film is formed while a $PH_3$ gas is introduced during the formation of the film to add phosphorus (P) thereto.

Figure 1C:
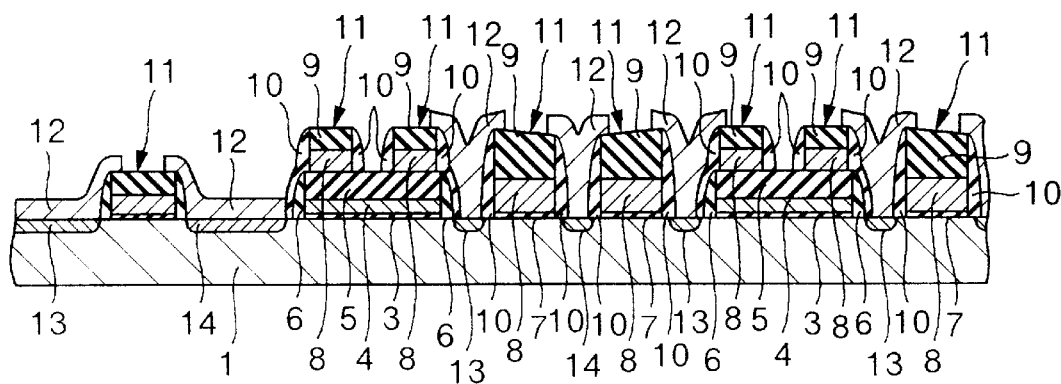

Next, as illustrated in FIG. 1C, the phosphorous added polycrystalline silicon film 22 is patterned and segmented on each electrode structure 11 to form draw-out electrodes 12. Next, the silicon semiconductor substrate 1 is thermally treated. During this thermal treatment, phosphorus is thermally diffused from the draw-out electrodes 12 into the underlying silicon semiconductor substrate 1 to form sources 13 and drains 14, which are pairs of impurity diffused layers. In other words, each draw-out electrode 12 serves as a pad for the source 13 and the drain 14 associated therewith.

Figure 1D:
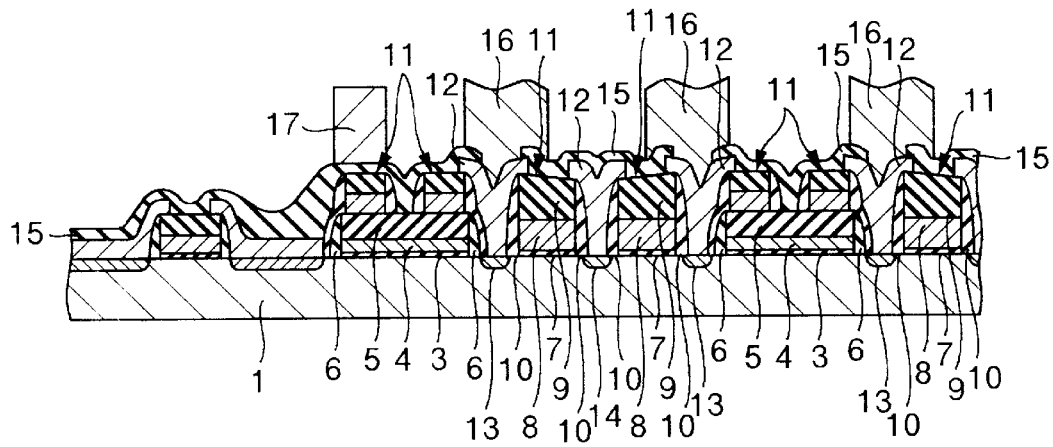

Subsequently, as illustrated in FIG. 1D, an inter-layer insulating film 15, made of a silicon oxide film, is formed over the entire surface by a low pressure CVD method, and the inter-layer insulating film 15 is patterned to expose a portion of the surface of each draw-out electrode 12. Afterward, a bit line (not shown) is patterned so as to be connected with the drain 14 through the draw-out electrode 12.

Next, a polycrystalline silicon film is formed over the entire surface in a thickness of approximately 400 nm to 1,000 nm by a low pressure CVD method. In this event, for improving the conductivity of the polycrystalline silicon film, an undoped polycrystalline silicon film is formed while a $PH_3$ gas is introduced during the formation of the film to add phosphorus (P) thereto.

Subsequently, as illustrated in FIGS. 1D and 2A, the polycrystalline silicon film is patterned to form each storage node electrode 16 such that the storage node electrode 16 is connected with the associated source 13 through the associated draw-out electrode 12, and to simultaneously form an electrically isolated dummy pattern 17 on the inter-layer insulating film 15. This dummy pattern 17 is formed in close proximity to a site at which the largest difference in level is formed due to the storage node electrode 16 having a relatively large thickness, in this embodiment, a storage node electrode 16 formed in an outer edge area of the storage node electrodes 16 arranged in a matrix form in the respective element active regions.

Figure 1E:
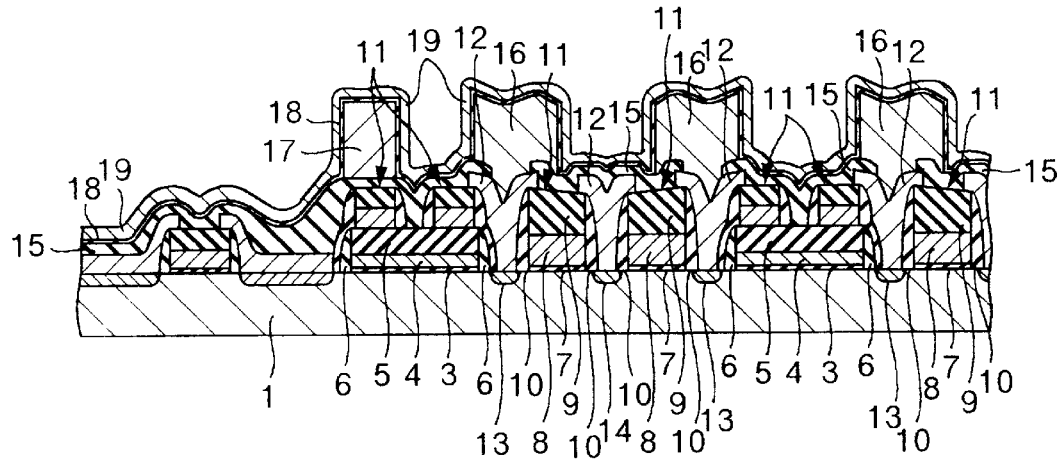

Next, as illustrated in FIG. 1E, a dielectric film 18, made of a silicon nitride film, is formed by a CVD method over the entire surface including the storage node electrodes 16 and the dummy pattern 17. Here, the dielectric film may be suitably formed of an NO film of a two-layer structure, which includes a silicon nitride film and a silicon oxide film formed in sequence, or an ONO film of a three-layer structure, which includes a silicon nitride film, a silicon oxide film and a silicon nitride film formed in sequence, in place of a silicon nitride film.

Subsequently, a polycrystalline silicon film is formed by a low pressure CVD method over the dielectric film 18 in a thickness of approximately 50 nm to 200 nm. Then, the polycrystalline silicon film is subjected to photolithography and subsequent dry etching to pattern the polycrystalline silicon film into cell plate electrodes 19 which overlie the respective storage node electrodes 16 arranged in a matrix form and the dummy pattern 17 through the dielectric film 18.

Figure 3A:
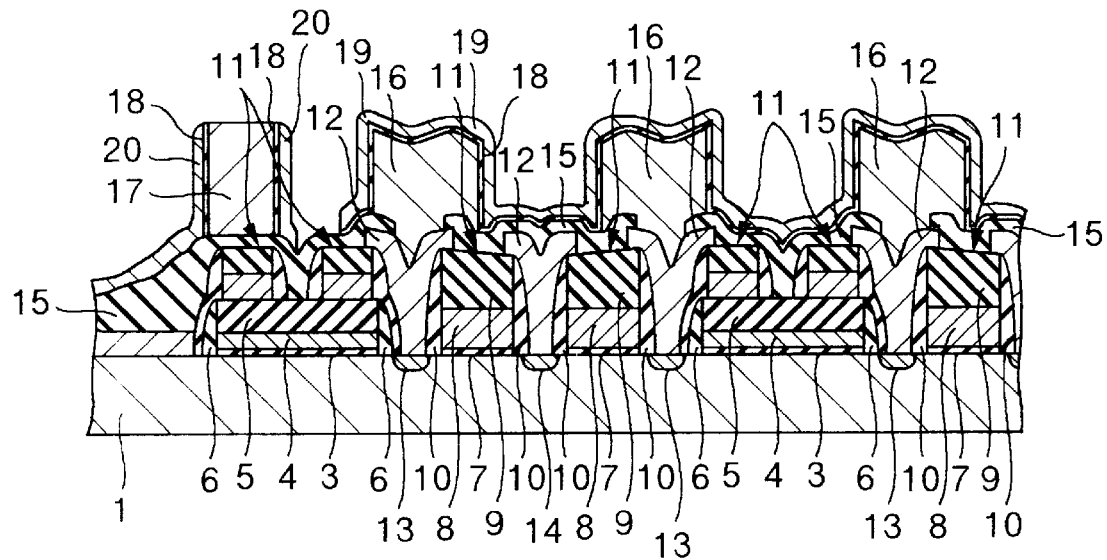
FIGS. 3A and 3B are cross-sectional views illustrating main steps in another method of manufacturing the semiconductor device according to the first embodiment of the present invention.

Alternatively, the dielectric film 18 and the cell plate electrode 19 may not exist on the dummy pattern 17, as illustrated in FIG. 3A. In this case, a photomask formed to expose a portion of the polycrystalline silicon film on the dummy pattern 17 may be used when the polycrystalline silicon film is patterned into the cell plate electrodes 19 after the steps illustrated in FIGS. 1A–1E have been performed. As a result, when the polycrystalline silicon film is patterned into the cell plate electrodes 19, side walls 20, mainly made of the polycrystalline silicon film, are formed to cover the side surfaces of the dummy pattern 17 (see FIG. 3A).

Figure 1F:
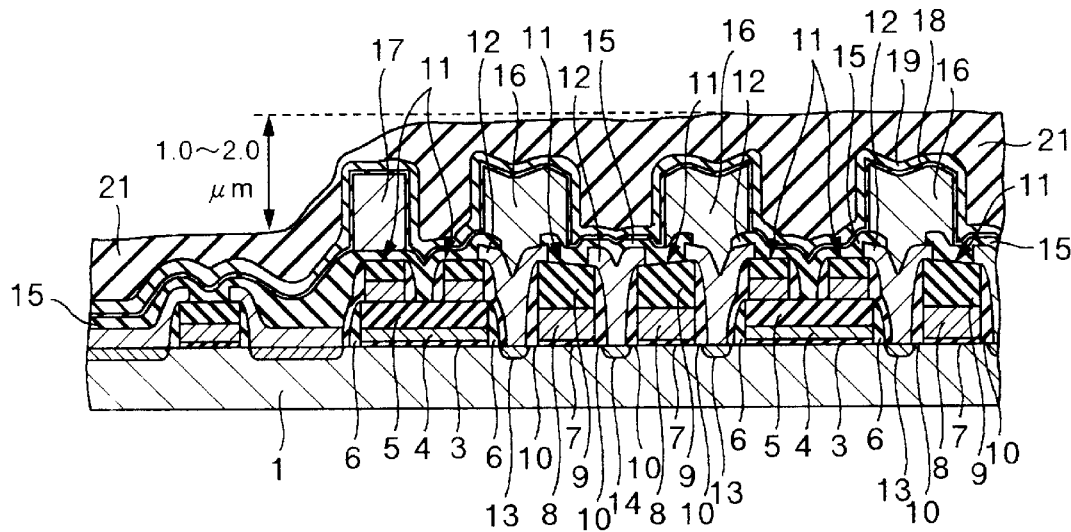

Next, as illustrated in FIG. 1F, an inter-layer insulating film, a BPSG (Boro-Phospho Silicate Glass) film 21 in this embodiment, is formed by a CVD method over the entire surface including the cell plate electrodes 19 in a thickness of approximately 400 nm to 700 nm. As an alternative, the inter-layer insulating film may be formed of a PSG (Phospho-Silicate Glass) film, or a three-layered film including a silicon oxide film made by a CVD method, a SOG (Spin On Glass) film and a silicon oxide film, which are stacked in sequence, in place of the BPSG film 21.

Figure 1G:
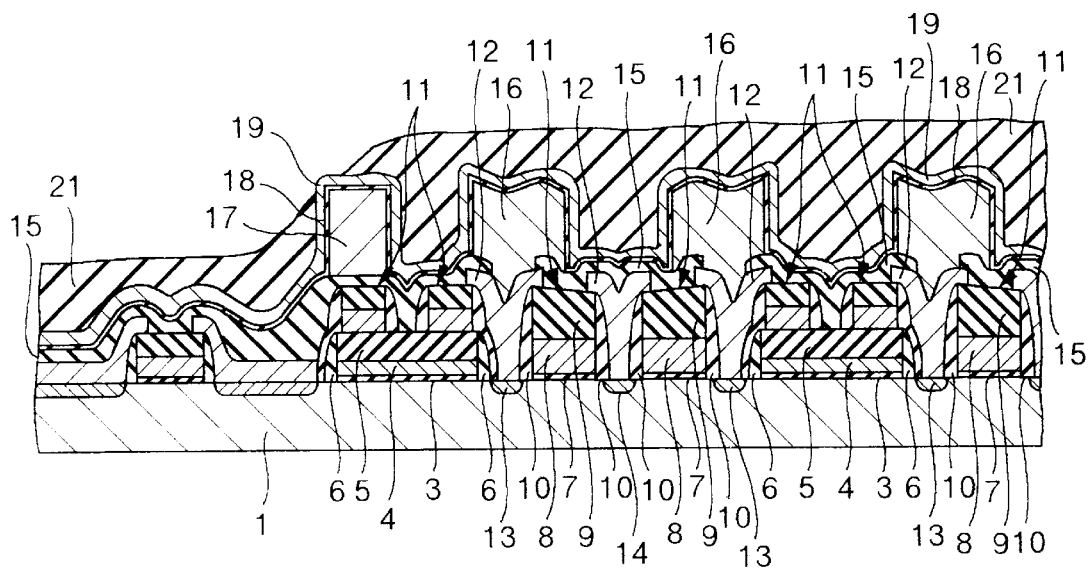

Next, the silicon semiconductor substrate 1 is thermally treated at approximately 850° C. to 900° C. for approximately 10 minutes to 30 minutes to reflow the surface of the BPSG film 21. Here, a large number of dummy patterns 17 may be formed along the electrode structures 11, or a longer dummy pattern may be formed to improve the planarity for the BPSG film 21 in the memory cell region. Afterward, the surface of the BPSG film 21 is etched back, as illustrated in FIG. 1G. After the thermal treatment, since a slope of the BPSG film 21 is abrupt near the dummy pattern 17 (having a height of approximately 1.0 μm to 2.0 μm), the BPSG film 21 has the smallest thickness near this dummy pattern 17. Therefore, with the dummy pattern 17 used as an index for ending the etch back to the BPSG film 21, the BPSG film 21 is etched back until a portion of the cell plate electrode 19 covering the dummy pattern 17 is exposed. Specifically, assuming that 100% denotes a state in which the entirety of the cell plate electrode 19 covering the dummy pattern 17 through the dielectric film 18 is exposed, the etch back is ended when approximately 0.5% to 2.0% of the cell plate electrode 19 is exposed.

Figure 3B:
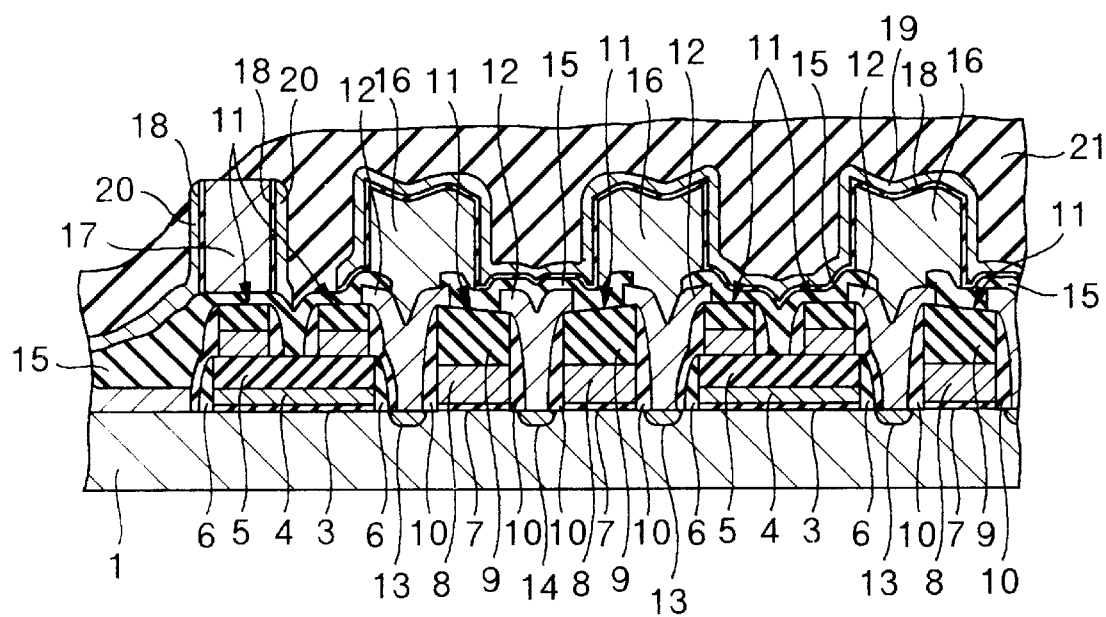

When the dummy pattern 17 is formed with the side walls 20 on its side surfaces as illustrated in FIG. 3A, the etch back is performed until a portion of the dummy pattern 17 (and a portion of the side wall 20) is exposed, as an index for ending the etch back to the BPSG film 21 (FIG. 3B).

In the structure illustrated in FIGS. 3A and 3B, since the dummy pattern 17 is formed to have a reduced height by the thickness of the cell plate electrode 19, the difference in level is effectively reduced gradually in a boundary zone between the memory cell region and the peripheral circuit region in this etch back step.

Subsequently, in a region which does not appear in the cross-sectional views of FIGS. 1A to 1H, the BPSG film 21 and the inter-layer insulating film 15 are perforated to form a contact hole for exposing a portion of the surface of the gate electrode 8 in each electrode structure 11. Then, Ti (titanium) having a thickness of approximately 20 nm to 40 nm and TiN (titanium nitride) having a thickness of approximately 50 nm to 100 nm are sequentially stacked in the contact hole by a sputtering method to form an underlying film. Subsequently, W (tungsten) is formed by a CVD method to fill the contact hole. Then, anisotropic dry etching is performed to form a tungsten plug for filling up the contact hole.

Figure 1H:
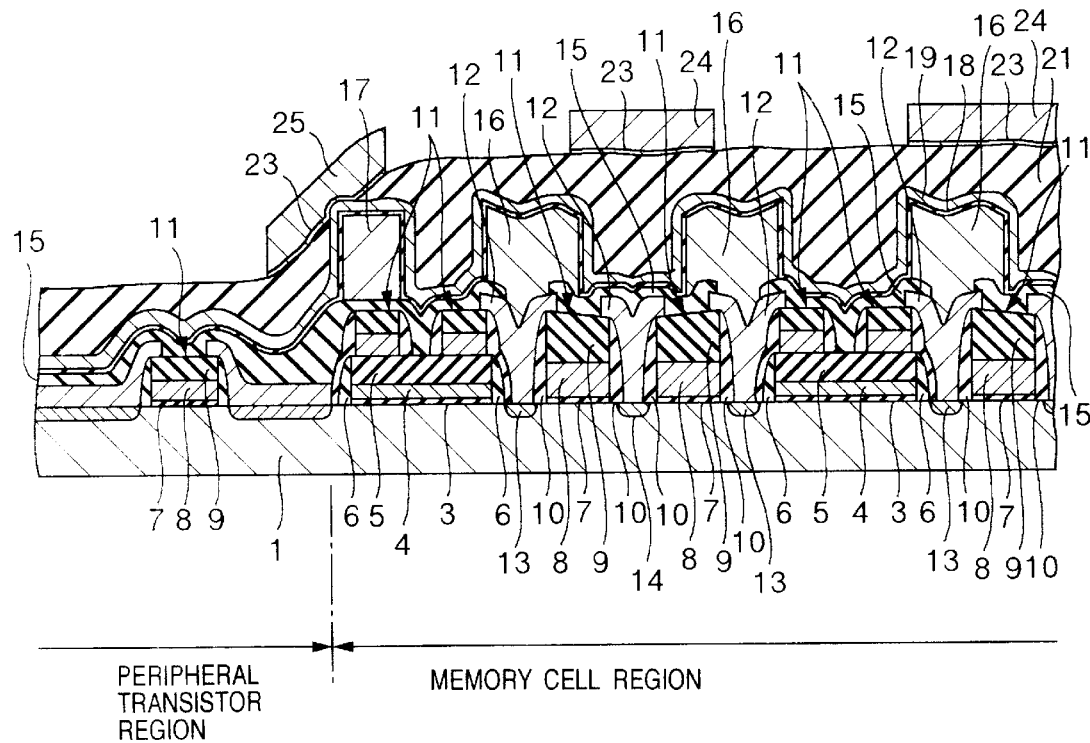

Next, as illustrated in FIGS. 1H and 2C, a TiN film is formed by a sputtering method over the entire surface of the BPSG film 21 including the tungsten plugs to have a thickness of approximately 50 nm to 100 nm as an underlying film 23, followed by the formation of an aluminum alloy film by a sputtering method over the underlying film 23. Subsequently, these aluminum alloy film and TiN film are subjected to photolithography and subsequent dry etching to form a metal wiring film 24 connected to the tungsten plugs and a metal wiring film 25 connected to portions of the cell plate electrodes 19 exposed from the surface of the BPSG film 21. Here, the metal wiring film 24 is connected to each gate electrode 8 through the above-mentioned contact hole and serves as a lining wire which contribute to a reduction in the resistance of the gate electrode 8. The metal wiring film 25 in turn has a function of reducing the slope of the BPSG film 21 near the dummy pattern 17 as well as a function of fixing a potential at each cell plate electrode 19 at a predetermined value, for example, ½×VCC.

As described above, the method of manufacturing the DRAM according to the first embodiment involves the formation of the dummy pattern 17 at the same hierarchical position as the storage node electrodes 16. Since the dummy pattern 17 is formed together with a predetermined conductive film, it can be readily formed without increasing the number of manufacturing steps. Then, a superficial layer of the BPSG film 21 is removed until a portion of a conductive film covering the dummy pattern 17, the cell plate electrode 19 in this embodiment, is exposed for planarization. In this event, the dummy pattern 17 serves as an index to form a planar BPSG film 21 with a reduced slope over a difference in level between components of the device, precisely in accordance with a design. Since the dummy pattern 17 does not function as a storage node electrode, a variety of wiring films, i.e., the metal wiring films 24, 25 in this embodiment, may be formed precisely on the planar BPSG film 21 without a fear of possible short-circuiting.

Further, by actively forming the metal wiring film 25 to be electrically connected with the dummy pattern 17, the metal wiring film 25 contributes to a reduced slope near the dummy pattern 17 as well as serves to fix the potential at the cell plate electrode 19 covering the dummy pattern 17.

Next, several examples of modifications to the first embodiment will be described with reference to FIGS. 4 and 5 wherein components in the modified examples identical to those in the DRAM of the first embodiment are designated the same reference numerals, and description thereon is omitted.

MODIFIED EXAMPLE 1

First, Modified Example 1 will be described with reference to FIG. 4. The Modified Example 1, although having substantially a similar configuration as the DRAM of the first embodiment, differs in the shape of the dummy pattern.

Figure 4:
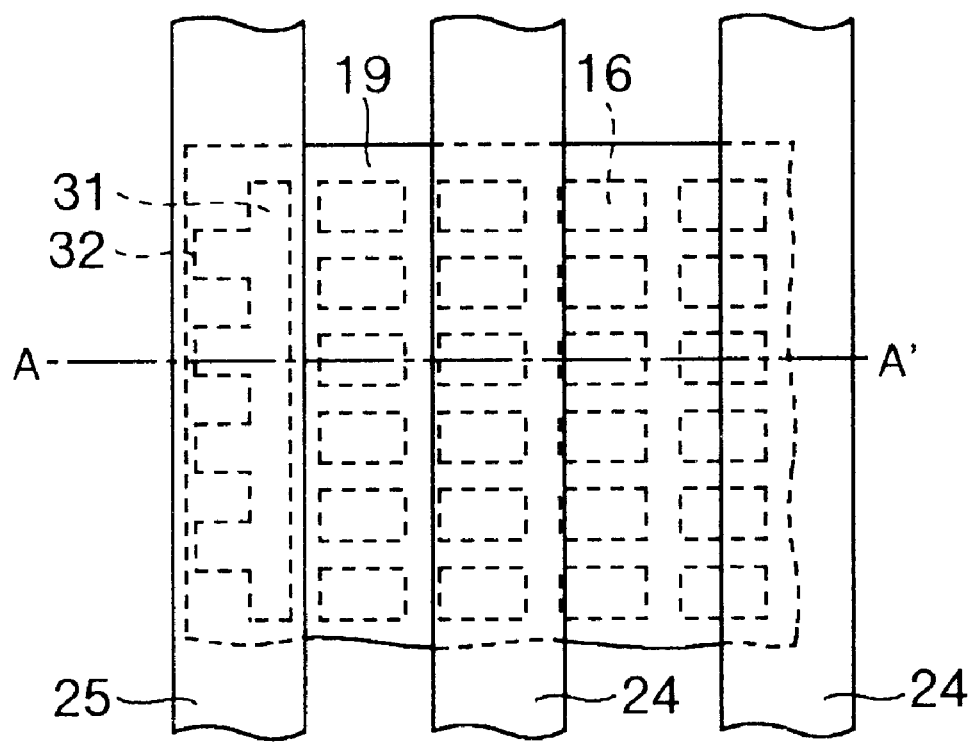
FIG. 4 is a plan view illustrating a modified example 1 of the semiconductor device according to the first embodiment of the present invention.

As illustrated in FIG. 4, a DRAM according to the Modified Example 1 has a dummy pattern 31 formed along a line adjacent to storage node electrodes 16 arranged in a matrix form. The dummy pattern 31 has protrusions 32 extending outwardly.

According to the Modified Example 1, the dummy pattern 31 is formed at the same hierarchical position as the storage node electrodes 16 in a manner similar to the first embodiment. In this way, since the dummy pattern 31 is formed together with a predetermined conductive film, it can be readily formed without increasing the number of manufacturing steps. Then, a superficial layer of a BPSG film 21 is removed for planarization until a portion of a conductive film covering the dummy pattern 31, here a cell plate electrode 19, is exposed. In this event, the dummy pattern 31 serves as an index to form a planar BPSG film 21 with a reduced slope over a difference in level between the components, precisely in accordance with a design. Since the dummy pattern 31 does not function as a storage node electrode, a variety of wiring films, metal wiring films 24, 25 in this example, may be formed precisely on the planar BPSG film 21 without a fear of possible short-circuiting.

Further, by intentionally forming the metal wiring film 25 to be electrically connected with the dummy pattern 31, the metal wiring film 25 serves to fix the potential at the cell plate electrodes 19 covering the dummy pattern 31 as well as contributes to a reduced slope near the dummy pattern 17.

Furthermore, since the dummy pattern 31 is formed at a location where the largest difference of level in the device is formed due to the storage node electrodes 16 having a relatively large thickness, i.e., in close proximity to a column of the storage node electrodes 16 formed along one outer edge of a matrix of the storage node electrodes 16 arranged in the respective element active regions, in this example, the dummy pattern 31 serves as an index to enable a planar BPSG film 21 to be formed with a reduced slope over a difference in level between components, precisely in accordance with a design, thereby making it possible to provide a further reduction in the slope near the dummy pattern 31.

MODIFIED EXAMPLE 2

In continuation, Modified Example 2 of the first embodiment will be described with reference to FIG. 5. A DRAM according to the Modified Example 2, although having substantially a similar configuration as the DRAMs according to the first embodiment or the Modified Example 1, differs in the shapes of the storage node electrodes and the dummy pattern.

Figure 5:
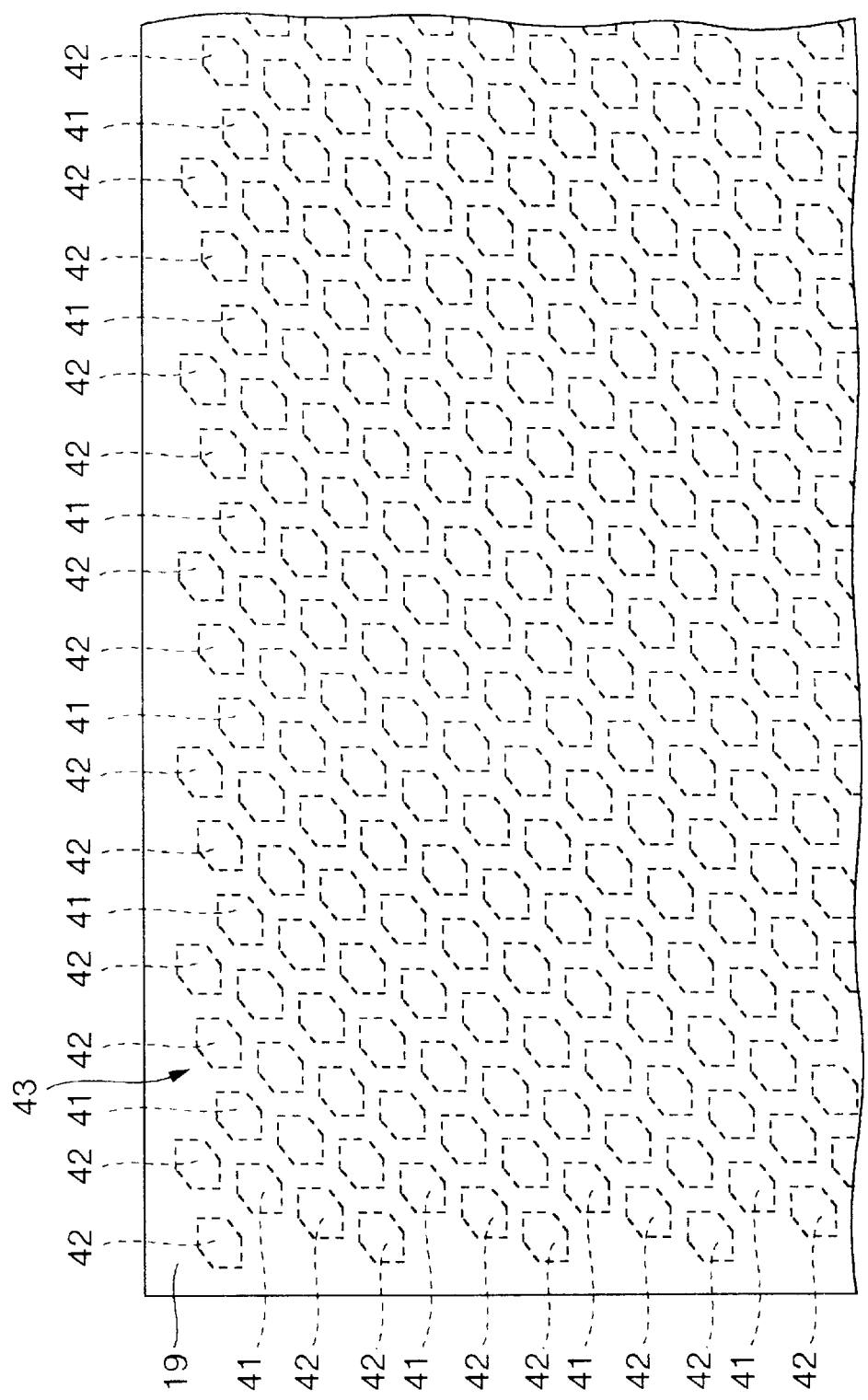
FIG. 5 is a plan view illustrating a modified example 2 of the semiconductor device according to the first embodiment of the present invention.

As illustrated in FIG. 5, a DRAM according to the Modified Example 2 has storage node electrodes 42, each formed into a polygon having five or more corners, a hexagon in this example. The storage node electrodes 42 are arranged in a lattice form having a pattern which repeats every three columns. On the other hand, dummy patterns 41, each having a hexagonal shape similar to that of the storage node electrodes 42, are arranged such that they are dispersed along the overall periphery of a memory cell array 43 and one dummy pattern 41 is positioned after every two storage node electrodes 42. The dummy patterns 41 may be formed to have a width smaller than the width of the storage node electrodes 42 by a slight amount, for example, in a range of 1 μm to 2 μm in consideration of the controllability of etching back the BPSG film 21 and so on.

According to the Modified Example 2, the dummy patterns 41 are formed at the same hierarchical position as the storage node electrodes 42 in a manner similar to the first embodiment. Thus, since the dummy patterns 41 are formed together with a predetermined conductive film, they can be readily formed without increasing the number of manufacturing steps. Then, a superficial layer of the BPSG film 21 is removed for planarization until a portion of the conductive film covering the dummy pattern 42, the cell plate electrodes 19 in this example, is exposed. In this event, the dummy patterns 41 serve as an index to form a planar BPSG film 21 with a reduced slope over a difference in level between components of the DRAM precisely in accordance with a design. Since the dummy patterns 41 do not function as storage node electrodes, a variety of wiring films, metal wiring films 24, 25 in this example, may be formed precisely on the planar BPSG film 21 without a fear of possible short-circuiting.

Further, by intentionally forming the metal wiring film 25 to be electrically connected with the dummy patterns 41, the metal wiring film 25 serves to fix the potential at the cell plate electrodes 19 covering the dummy patterns 41 as well as contributes to a reduced slope near the dummy patterns 41.

Furthermore, since the dummy patterns 41 are formed at locations where the largest difference of level in the device is formed due to the storage node electrodes 42 having a relatively large thickness, i.e., in close proximity to every two of the storage node electrodes 42 formed along four outer edges within a matrix of the storage node electrodes 42 arranged in the respective element active regions, in this example, the dummy patterns 41 serve as an index to enable a planar BPSG film 21 to be formed with a reduced slope over a difference in level between components of the DRAM precisely in accordance with a design, thereby making it possible to provide a further reduction in the slope near the dummy patterns 41.

(Second Embodiment)

Next, a second embodiment of the present invention will be described with reference to FIGS. 6A to 6G. A DRAM according to the second embodiment, although having substantially a similar configuration to the DRAM according to the first embodiment, it differs in that a different kind of conductive film is added for forming a dummy pattern. The configuration of the DRAM according to the second embodiment will be described along with a manufacturing method thereof. FIGS. 6A to 6G are schematic cross-sectional views illustrating in order main steps in the method of manufacturing the DRAM according to the second embodiment, wherein components identical to those in the DRAM of the first embodiment are designated the same reference numerals. In addition, since the peripheral transistor region is the same as that in the first embodiment, this region is omitted in the figures and the following description.

For manufacturing the DRAM according to the second embodiment, the step illustrated in FIG. 1A is first performed in a manner similar to the first embodiment.

Figure 6A:
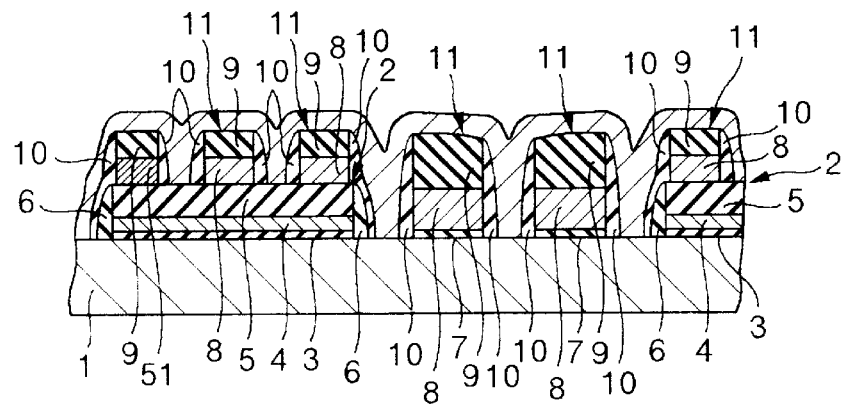
FIGS. 6A to 6G are cross-sectional views illustrating main steps in a method of manufacturing a semiconductor device according to a second embodiment of the present invention.

Then, as illustrated in FIG. 6A, a silicon oxide film 9, a polycrystalline silicon film 8 and a gate oxide film 7 are subjected to photolithography and subsequent dry etching to pattern these films into electrodes which extend over element active regions and field shield element separating structures 2 as well as to form a dummy pattern 51 made from the polycrystalline silicon film 8 at a site close to an electrode located at an outer edge of the thus patterned electrodes. In this event, the surface of a silicon semiconductor substrate 1 remains exposed in the element active region except for sites at which the electrodes are formed. Subsequently, a silicon oxide film is formed over the entire surface, and anisotropic dry etching is performed over the entire surface of this silicon oxide film to leave the silicon oxide film only on side surfaces of the silicon oxide films 9, the polycrystalline silicon films 8 and the gate oxide films 7, patterned into electrodes, and the side walls 6, as well as side surfaces of the dummy pattern 51 and the gate oxide film 7 to form side walls 10, thus completing electrode structures 11. In each electrode structure 11, the patterned polycrystalline silicon film 8 is formed into a gate electrode and also functions as a word line in each element active region. The dummy pattern 51 in turn is left in an electrically isolated state.

Subsequently, a polycrystalline silicon film is formed by a low pressure CVD method over the entire surface so as to fill spaces between adjacent electrode structures 11 in respective element active regions. In this event, for improving the conductivity of the polycrystalline silicon film, an undoped polycrystalline silicon film is formed while a PH$_3$ gas is introduced during the formation of the film to add phosphorus (P) thereto.

Figure 6B:
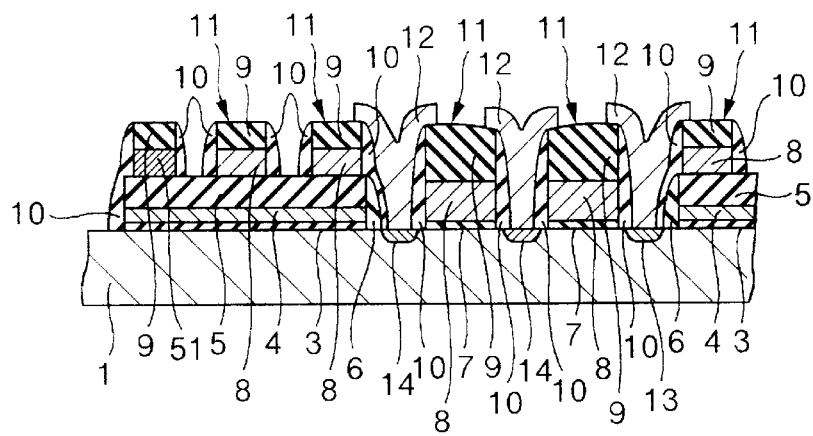

Next, as illustrated in FIG. 6B, the phosphorous added polycrystalline silicon film is patterned and segmented on each electrode structure 11 to form draw-out electrodes 12. Next, the silicon semiconductor substrate 1 is thermally treated. During this thermal treatment, phosphorus is thermally diffused from the draw-out electrodes 12 into the underlying silicon semiconductor substrate 1 to form sources 13 and drains 14, which are pairs of impurity diffused layers. In other words, each draw-out electrode 12 serves as a pad for the source 13 and the drain 14 associated therewith.

Subsequently, an inter-layer insulating film 15, made of a silicon oxide film, is formed over the entire surface by a low pressure CVD method, and the inter-layer insulating film 15 is patterned to expose a portion of the surface of each draw-out electrode 12. Afterward, a bit line (not shown) is patterned so as to be connected with the drain through the draw-out electrode 12.

Next, a polycrystalline silicon film is formed over the entire surface in a thickness of approximately 400 nm to 1,000 nm by a low pressure CVD method. In this event, for improving the conductivity of the polycrystalline silicon film, an undoped polycrystalline silicon film is formed while a $PH_3$ gas is introduced during the formation of the film to add phosphorus (P) thereto.

Figure 6C:
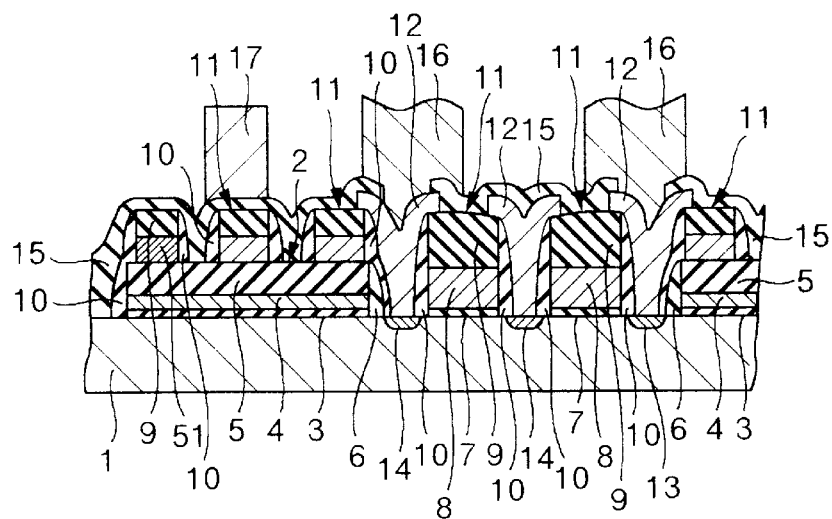

Subsequently, as illustrated in FIG. 6C, the polycrystalline silicon film is patterned to form storage node electrodes 16 such that each storage node electrode 16 is connected with the associated source 13 through the associated draw-out electrode 12, and to simultaneously form an electrically isolated dummy pattern 17 on the inter-layer insulating film 15. Here, the dummy pattern 17 is formed to have its outer end positioned slightly inwardly from the outer end of the underlying dummy pattern 51 located therebeneath through the inter-layer insulating film 15 and the silicon oxide film 9. These dummy patterns 51, 17 are formed in close proximity to a site at which the largest difference of level is formed due to the storage node electrode 16 having a relatively large thickness, in this embodiment, a storage node electrode 16 formed in an outer edge area of the storage node electrodes 16 formed in respective element active regions and arranged in a matrix form.

Figure 6D:
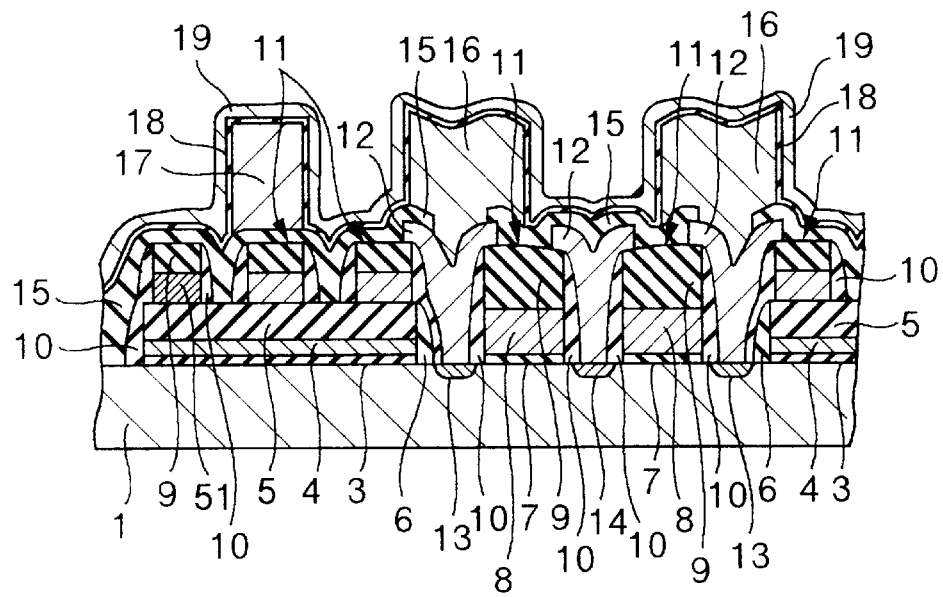

Next, as illustrated in FIG. 6D, a dielectric film 18, made of a silicon nitride film, is formed by a CVD method over the entire surface including the storage node electrodes 16 and the dummy pattern 17. Here, the dielectric film 18 may be suitably formed of an NO film of a two-layer structure, which includes a silicon nitride film and a silicon oxide film formed in sequence, or an ONO film of a three-layer structure, which includes a silicon nitride film, a silicon oxide film and a silicon nitride film formed in sequence, in place of a silicon nitride film.

Subsequently, a polycrystalline silicon film is formed by a low pressure CVD method over the dielectric film 18 in a thickness of approximately 100 nm to 200 nm. Then, the polycrystalline silicon film is subjected to photolithography and subsequent dry etching to pattern the polycrystalline silicon film into cell plate electrodes 19 which overlie the respective storage node electrodes 16 arranged in a matrix form and the dummy pattern 17 through the dielectric film 18.

Alternatively, the dielectric film 18 and the cell plate electrode 19 may not exist on the dummy pattern 17. In this case, a photomask formed to expose a portion of the polycrystalline silicon film on the dummy pattern 17 may be used when the polycrystalline silicon film is patterned into cell plate electrodes 19. Thus, when the polycrystalline silicon film is patterned into cell plate electrodes 19, side walls 20, mainly made of the polycrystalline silicon film, is formed to cover the side surfaces of the dummy pattern 17 in a manner similar to the first embodiment as illustrated in FIGS. 3A and 3B.

Figure 6E:
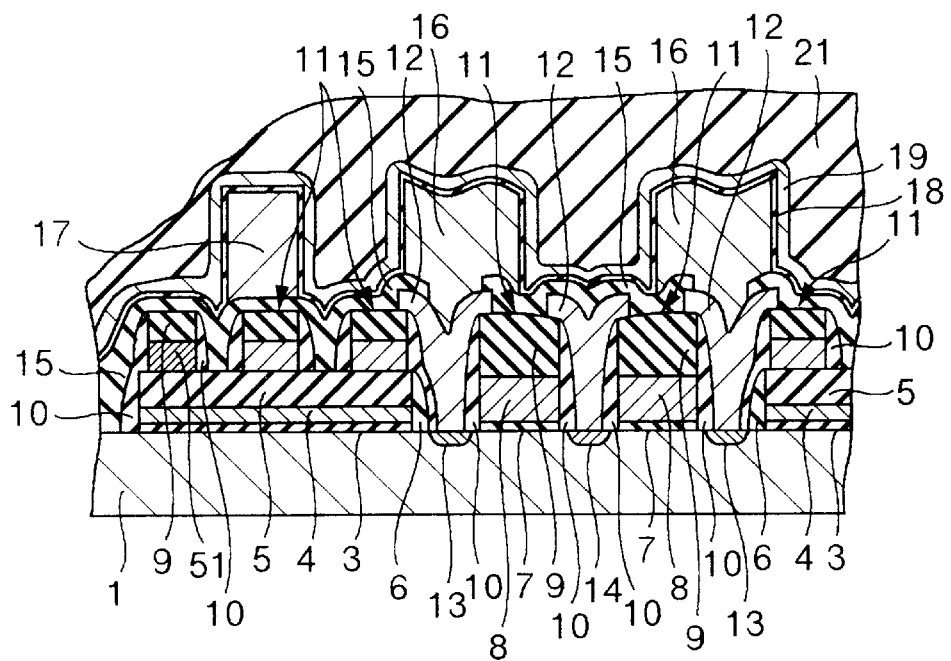

Next, as illustrated in FIG. 6E, an inter-layer insulating film, a BPSG film 21 in this embodiment, is formed by a CVD method over the entire surface including the cell plate electrodes 19 in a thickness of approximately 400 nm to 700 nm. As an alternative, the inter-layer insulating film may be formed of a PSG film, or a three-layered film composed of a silicon oxide film made by a CVD method, a SOG film and a silicon oxide film, which are stacked in sequence, in place of the BPSG film 21.

Figure 6F:
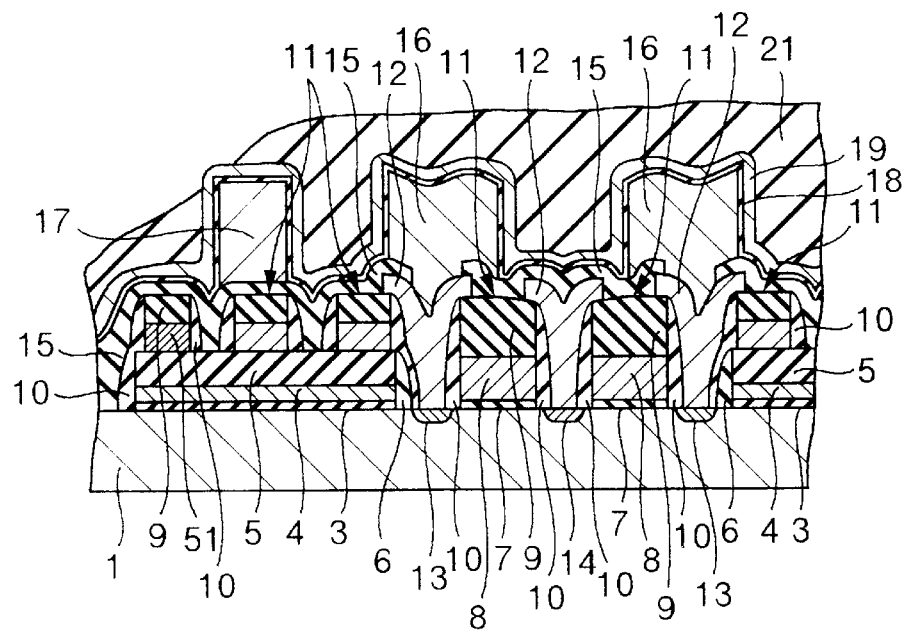

Next, the silicon semiconductor substrate 1 is thermally treated at 850° C. to 900° C. for 10 minutes to 30 minutes to reflow the surface of the BPSG film 21. Then, the surface of the BPSG film 21 is etched back as illustrated in FIG. 6F. Here, after the thermal treatment, since a slope of the BPSG film 21 is abrupt near the dummy patterns 51, 17 (a difference of height is approximately 1.0 μm to 2.0 μm), the BPSG film 21 has the smallest thickness near the dummy pattern 17 (it can also be thought that the BPSG film 21 has the smallest thickness near the dummy pattern 51). Therefore, with the dummy pattern 17 used as an index for ending the etch back to the BPSG film 21, the etch back is performed until a portion of the cell plate electrode 19 covering the dummy pattern 17 is exposed. Specifically, assuming that 100% denotes a state in which the entirety of the cell plate electrode 19 covering the dummy pattern 17 through the dielectric film 18 is exposed, the etch back is ended when approximately 1% of the cell plate electrode 19 is exposed.

Subsequently, in a region which does not appear in the cross-sectional views of FIGS. 6A to 6F, the BPSG film 21 and the inter-layer insulating film 15 are perforated to form a contact hole for exposing a portion of the surface of the gate electrode 8 in each electrode structure 11. Then, Ti (titanium) having a thickness of approximately 20 nm to 40 nm and TiN (titanium nitride) having a thickness of approximately 50 nm to 100 nm are sequentially stacked in the contact hole by a sputtering method to form an underlying film. Subsequently, W (tungsten) is formed by a CVD method to fill the contact hole. Then, anisotropic dry etching is performed to form a tungsten plug for filling up the contact hole.

Figure 6G:
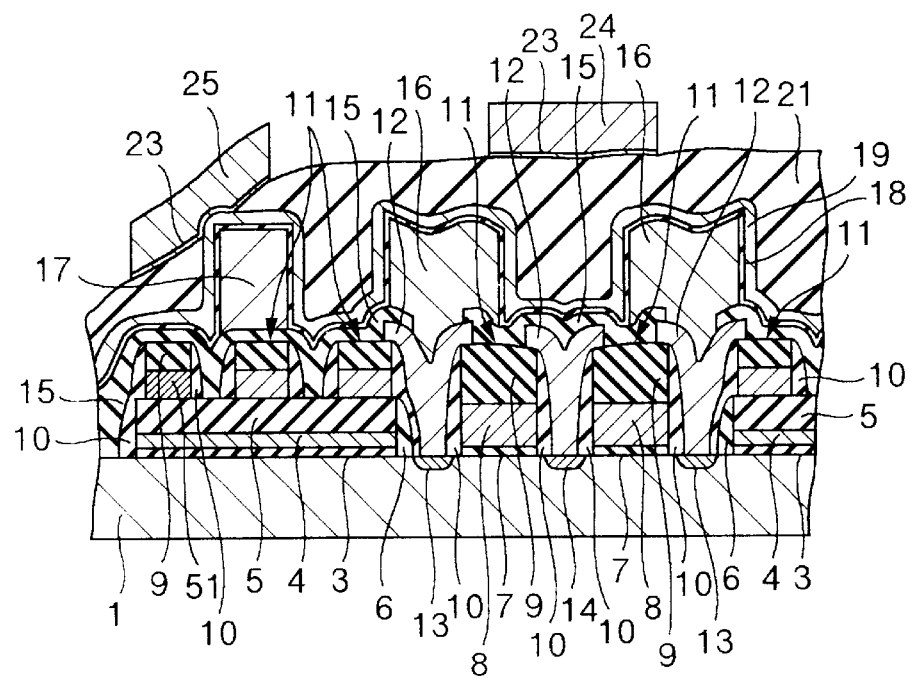

Next, as illustrated in FIG. 6G, a TiN film is formed by a sputtering method over the entire surface of the BPSG film 21 including the tungsten plugs in a thickness of approximately 50 nm to 100 nm as an underlying film 23, followed by the formation of an aluminum alloy film by a sputtering method over the underlying film 23. Subsequently, these aluminum alloy film and TiN film are subjected to photolithography and subsequent dry etching to form a metal wiring film 24 connected to the tungsten plugs and a metal wiring film 25 connected to a portion of the cell plate electrode 19 exposed from the surface of the BPSG film 21. Here, the metal wiring film 24 is connected to each gate electrode 8 through the above-mentioned contact hole and serves as a lining wire which contributes to a reduction in the resistance of the gate electrode 8. The metal wiring film 25 in turn has a function of reducing the slope of the BPSG film 21 near the dummy pattern 17 as well as a function of fixing a potential at the cell plate electrode 19 at a predetermined value, for example, ½VCC.

As described above, the method of manufacturing the DRAM according to the second embodiment involves the formation of the dummy pattern 51 at the same hierarchical position as the gate electrodes 8 of the gate electrode structure 11 and the formation of the dummy pattern 17 at the same hierarchical position as the storage node electrodes 16. Since the dummy patterns 51, 17 are formed together with their respective predetermined conductive films, they can be readily formed without increasing the number of manufacturing steps. Then, a superficial layer of the BPSG film 21 is removed for planarization until a portion of the conductive film covering the dummy pattern 17, the cell plate electrode 19 in this embodiment, is exposed. In this event, the dummy pattern 17 and/or 51 serves as an index to form a planar BPSG film 21 with a reduced slope over a difference in level between components of the DRAM, precisely in accordance with a design. Since the dummy pattern 17 and/or 51 does not function as a storage node electrode, a variety of wiring films, the metal wiring films 24, 25 in this embodiment, may be formed precisely on the planar BPSG film 21 without taking into account possible short-circuiting.

Further, by intentionally forming the metal wiring film 25 to be electrically connected with the dummy pattern 17, the metal wiring film 25 serves to fix the potential at the cell plate electrode 19 covering the dummy pattern 17 as well as contributes to a reduced slope near the dummy pattern 17.

Furthermore, in the case where not only the dummy pattern 17 but also the dummy pattern 51 is additionally formed slightly outwardly to the dummy pattern 17, the slope near the dummy patterns 51, 17 is further reduced.

It is also preferable for the second embodiment to change the shape of the dummy pattern 17 or to form a large number of dummy patterns 17 along the outer periphery of the memory cell array in order to provide a more precise planarization for the BPSG film 21, as previously described in the Modified Examples 1, 2 of the first embodiment.

(Third Embodiment)

Next, a third embodiment of the present invention will be described with reference to FIGS. 7A to 7G which illustrate in order main steps of a method of manufacturing a DRAM according to the third embodiment, where components identical to those in the first embodiment are designated the same reference numerals. In addition, since the peripheral transistor region is the same as that in the first embodiment, this region is omitted in the figures and the following description.

Figure 7A:
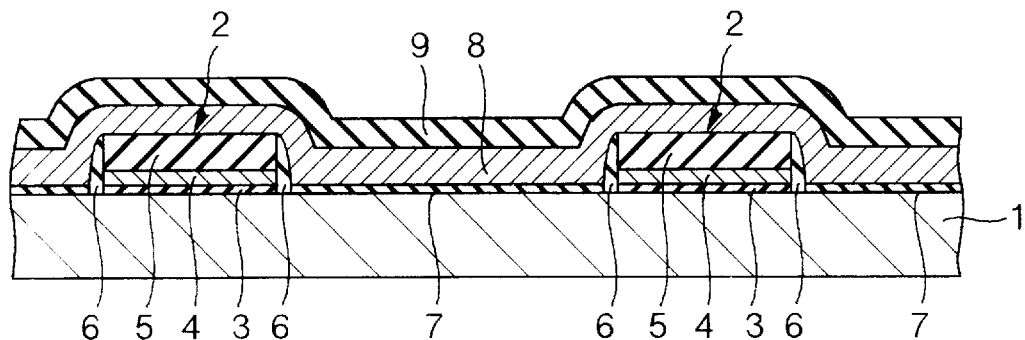
FIGS. 7A to 7G are cross-sectional views illustrating main steps in a method of manufacturing a semiconductor device according to a third embodiment of the present invention.

First, as illustrated in FIG. 7A, field shield element separating structures 2 are formed on a silicon semiconductor substrate 1. Then, a gate oxide film 7 is formed by thermal oxidization, and a phosphorus added polycrystalline silicon film 8 and a silicon oxide film 9 are deposited over the gate oxide film 7.

Figure 7B:
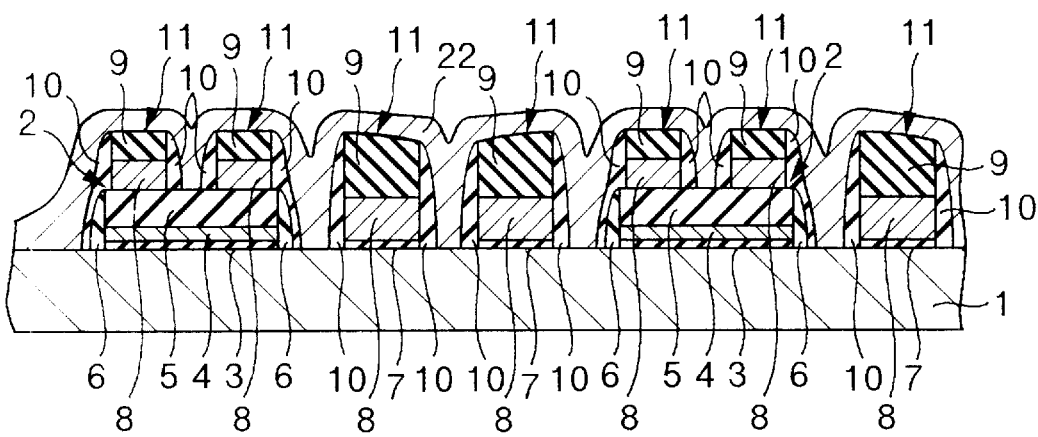

Next, as illustrated in FIG. 7B, the gate oxide film 7, the polycrystalline silicon film 8 and the silicon oxide film 9 are patterned into electrodes, and side walls 10 are formed for respective electrodes to complete electrode structures 11. Further, a phosphorus added polycrystalline silicon film 22 is formed over the entire structure provided on the substrate 1. Up to this step, the third embodiment is substantially similar to the first embodiment.

Figure 7C:
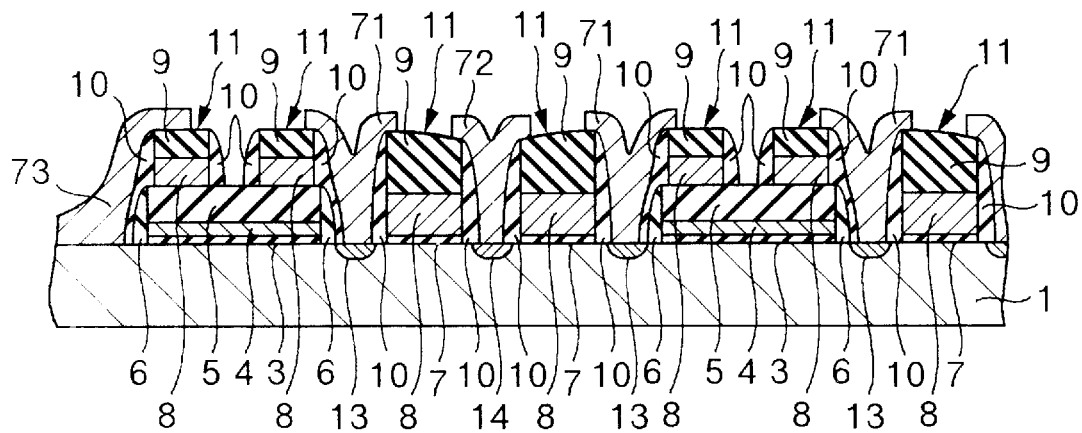

Next, as illustrated in FIG. 7C, the polycrystalline silicon film 22 is patterned and segmented on each electrode structure 11 to form a draw-out electrode 71 for connecting a source 13 to a lower electrode of a capacitor, a draw-out electrode 72 for connecting a drain 14 to a bit line, and a dummy pattern 73.

Figure 7D:
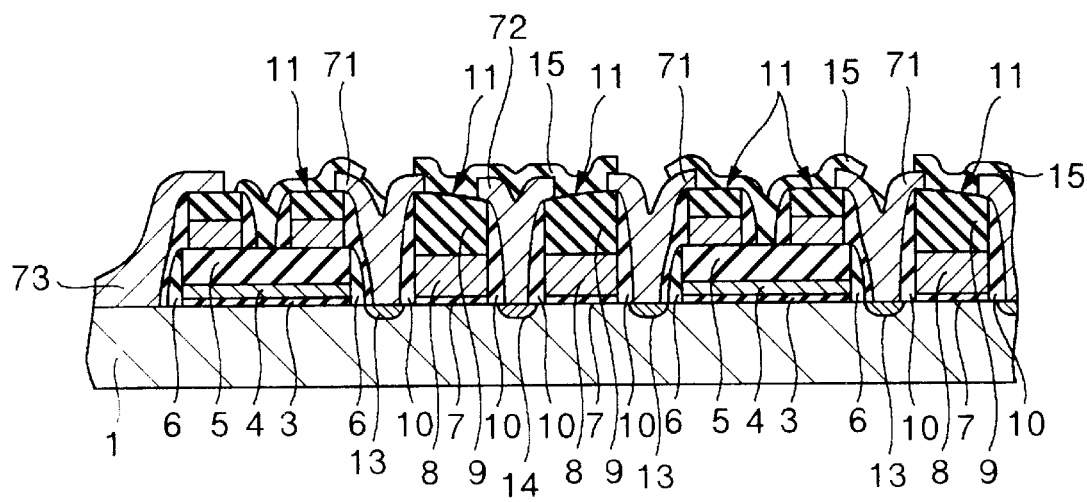

Subsequently, as illustrated in FIG. 7D, a silicon oxide film is deposited and patterned to form an inter-layer insulating film 15. In this event, the top portions of the draw-out electrodes 71, 72 are exposed.

Figure 7E:
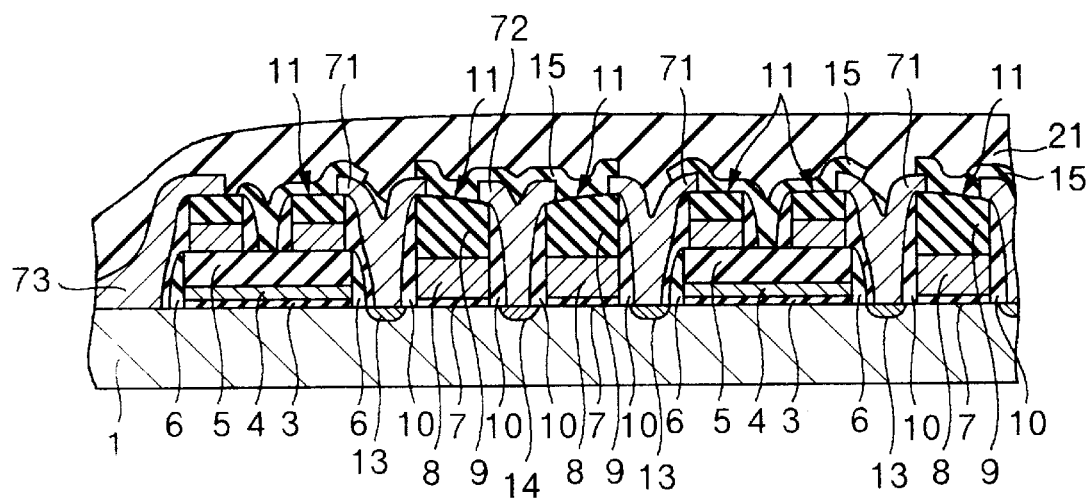
Figure 7F:
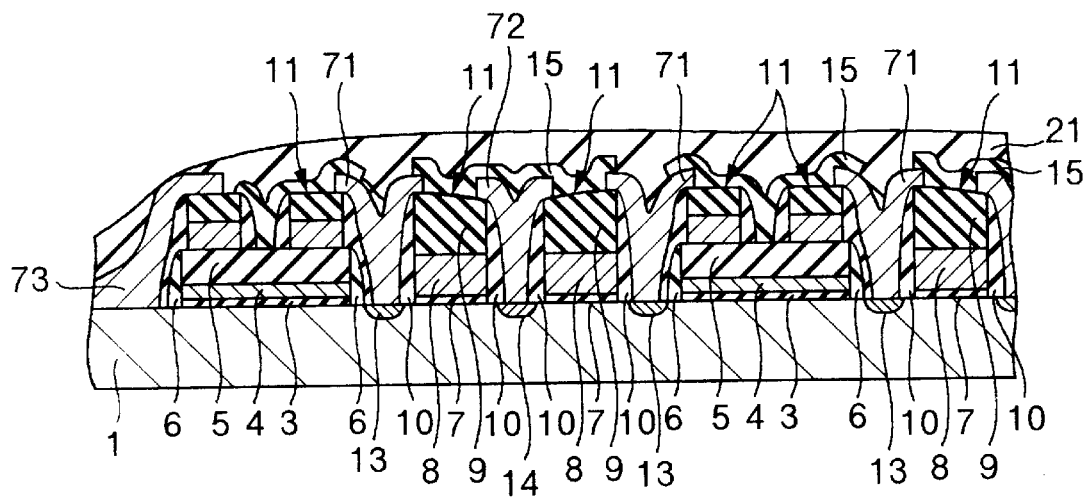

Next, as illustrated in FIG. 7E, an inter-layer insulating film 21 made of a BPSG film or the like is deposited by a CVD method in a thickness of 300 nm to 700 nm, and thermally treated at temperatures of approximately 850° C. to 900° C. for approximately 10 minutes to 30 minutes to planarize the surface thereof. After this thermal treatment, since a slope of the BPSG film 21 is abrupt near the dummy pattern 73 positioned in a peripheral portion of a memory cell region, the inter-layer insulating film 21 has the smallest thickness near this dummy pattern 73. Therefore, as the inter-layer insulating film 21 is etched back subsequent to the thermal treatment, polycrystalline silicon of the dummy pattern 73 is first exposed, so that the etch back is ended by detecting the time at which the polycrystalline silicon is exposed.

Figure 7G:
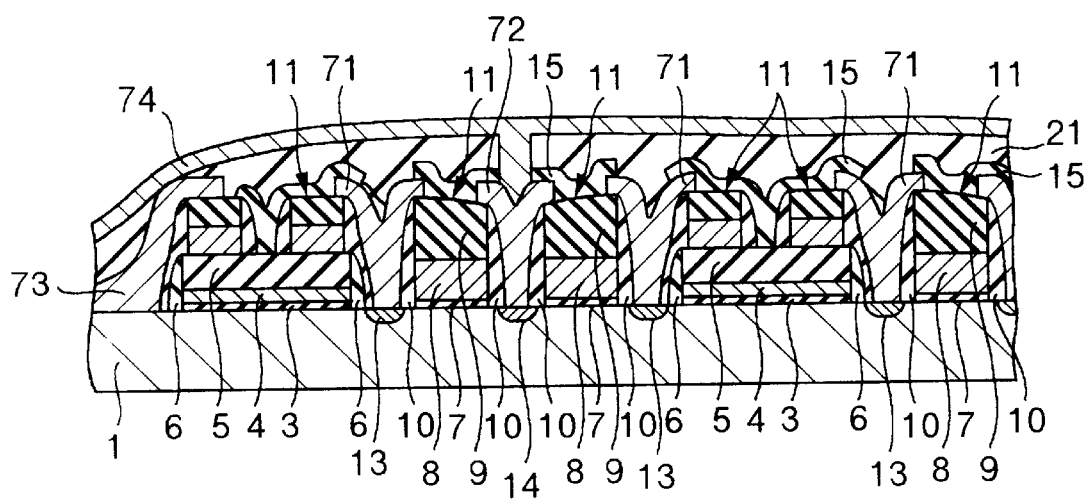

Further, as illustrated in FIG. 7G, contact holes are formed through the inter-layer insulating film 21 and the inter-layer insulating film 15, and a phosphorus added polycrystalline silicon film is deposited by a CVD method. Subsequently, WSi (tungsten silicon) is deposited by a sputtering method and patterned by photolithography and dry etch techniques to form a bit line 74. Afterward, capacitors and metal wires are formed in sequence.

It should be understood that the present invention is not limited to the foregoing embodiments. For example, another dummy pattern may be formed simultaneously with the pattern formation of the shield plate electrodes 4 of the field shield element separating structures 2 at the same hierarchical position as the shield plate electrodes 4 to provide a more reduced slope over a difference of level between components of the DRAM. In this case, the dummy pattern formed together with the shield plate electrodes 4 is preferably positioned closer to the peripheral transistor region than the dummy patterns 51, 17.

Also, when the bit line connected to the draw-out electrode 12 on the source 13 is formed, a further dummy pattern may be formed at the same hierarchical position as the bit line simultaneously with the pattern formation thereof, to provide a more reduced slope over a difference of level between components of the DRAM.

It should be noted that the present invention is applicable to a variety of other semiconductor devices as well as DRAMS. For example, when the present invention is applied to a non-volatile semiconductor memory such as EEPROM or the like, a dummy pattern may be formed simultaneously with the formation of insular floating gate electrodes, at the same hierarchical position thereof.

In this case, the floating gate corresponds to the polycrystalline silicon film 4 and a control gate corresponds to the polycrystalline silicon film 8 in FIGS. 1A to 1H and so on.

It should be also noted that in the present invention, the thickness of the semiconductor substrate 1 may be different in the memory cell forming region and the peripheral transistor forming region. For example, the semiconductor substrate 1 in the memory cell forming region is formed thinner than the semiconductor substrate 1 in the peripheral transistor forming region. This results in a difference of level or height between the memory cell forming region and the peripheral transistor forming region, thus making it possible to further reduce a level difference in a boundary zone between the memory cell forming region and the peripheral transistor forming region.

For example, as a method of forming a thinner substrate, a first silicon oxide film is formed on the silicon substrate 1, and then a silicon nitride film is formed on the silicon oxide film. Subsequently, portions of the silicon nitride film and the first silicon oxide film within the memory cell forming region are sequentially removed by photolithographic techniques and selective etching techniques to leave the silicon nitride film and the first silicon oxide film in the peripheral transistor region. Then, the substrate is thermally treated with the silicon nitride film used as a mask to form a second silicon oxide film in a LOCOS shape, made of a thermal oxide film, in the memory cell forming region. Thereafter, the silicon nitride film is removed, and the first silicon oxide film and the second silicon oxide film are also removed to provide the substrate 1 which has the height of the memory cell forming region lower than the height of the peripheral transistor forming region.

According to the present invention, in a semiconductor device, represented by DRAM, having a large difference in level between components, an inter-layer insulating film covering respective components can be planarized in accordance with a design to precisely reduce a slope over a difference in level between components without causing an increase in the number of manufacturing steps or introducing complicated manufacturing steps.

In connection with the description of the embodiments given above, the following items are also disclosed:

1. A method of manufacturing a semiconductor device including a plurality of selecting transistors and a plurality of memory capacitors electrically connected to the selecting transistors in a memory cell region, and including a plurality of peripheral transistors in a peripheral transistor region, the method comprising:

a first step of forming gate electrodes of the plurality of selecting transistors over a semiconductor substrate through a first insulating film, and forming gate electrodes of the plurality of peripheral transistors over the semiconductor substrate through a second insulating film;

a second step of forming sources and drains in the semiconductor substrate;

a third step of forming respective lower electrodes of the plurality of memory capacitors so as to be electrically connected to either the sources or the drains of the selecting transistors;

a fourth step of forming a dielectric film for the capacitors on the lower electrodes;

a fifth step of forming a conductive film on the dielectric film, and forming upper electrodes of the capacitors including the conductive film;

a sixth step of forming an inter-layer insulating film on the upper electrodes; and a seventh step of removing a superficial layer of the inter-layer insulating film until a portion of the upper electrodes is exposed, to planarize a surface of the inter-layer insulating film.

2. A manufacturing method as set forth in Item 1, wherein:
the inter-layer insulating film includes one of a BPSG (boro-phospho silicate glass) film and a PSG (phospho-silicate glass) film.

3. A manufacturing method as set forth in any of Items 1–2, wherein:
the first step includes forming a pattern layer serving as a dummy pattern, simultaneously with formation of the gate electrodes of the plurality of selecting transistors and the gate electrodes of the plurality of peripheral transistors over the semiconductor substrate through the insulating film.

4. A manufacturing method as set forth in any of Items 1–3, wherein:
the second step includes forming a pattern layer serving as a dummy pattern, simultaneously with formation of a plurality of draw-out electrodes electrically connected to portions serving as sources and drains in the semiconductor substrate.

5. A manufacturing method as set forth in any of Items 1–4, wherein:
the third step includes forming a first layer capable of serving as a conductive layer, and processing the first layer to form lower electrodes of the capacitors and to form a pattern layer serving as a dummy pattern.

6. A manufacturing method according to any of Items 1–5, further comprising:
an eighth step of forming an upper layer conductive film on the inter-layer insulating film after the seventh step; and
a ninth step of processing the upper layer conductive film to form a first wiring layer electrically connected to the underlying gate electrodes of the selecting transistors, and a second wiring layer electrically connected to the upper electrodes.

7. A method of manufacturing a semiconductor device as set forth in any of Items 1–6, wherein:
the seventh step includes a step of entirely etching at least a superficial layer of the inter-layer insulating film to planarize the inter-layer insulating film.

8. A method of manufacturing a semiconductor device as set forth in any of Items 1–7, further comprising:
forming the memory cell region and the peripheral transistor region such that a thickness of the substrate across an element active region of the memory cell region is different from a thickness of the substrate across an element active region of the peripheral transistor region.

9. A method of manufacturing a semiconductor device having a first region and a second region, the method comprising the steps of:
forming a conductive layer over a semiconductor substrate through a first insulating layer in a boundary zone between the first region and the second region;
forming a second insulating layer over the semiconductor substrate;
the step of forming the second insulating layer including forming the second insulating layer having a sloping area in a boundary zone between the first region and the second region; and
removing a superficial layer of the second insulating layer, until a portion of the conductive layer is exposed, to planarize a surface of the second insulating layer.

10. A manufacturing method as set forth in Item 9, further comprising the step of:
selectively forming un upper layer conductive film on the second insulating film, where the upper layer conductive film is electrically connected to the portion of the conductive layer.

11. A manufacturing method as set forth in Item 9 or 10, wherein:
the step of planarizing includes entirely etching back a surface of the second insulating film to remove the superficial layer of the second insulating film.

12. A method of manufacturing a semiconductor device comprising the steps of:
forming a first inter-layer insulating film over a semiconductor substrate;
forming a first layer including a layer capable of serving as a conductive layer on the first inter-layer insulating film;
patterning the first layer to form a plurality of first pattern layers including the first layer on the first inter-layer insulating film, where the plurality of first pattern layers are formed to define a regularly arranged first pattern group;

forming a second pattern layer including at least the first layer on the first inter-layer insulating film around the periphery of the first pattern group;

forming a second inter-layer insulating film on at least the first and second pattern layers; and planarizing a superficial layer of the second inter-layer insulating film, the step of planarizing removing the superficial layer of the second inter-layer insulating film until a portion of the second pattern layer is exposed.

13. A method of manufacturing a semiconductor device comprising the steps of:

forming a first inter-layer insulating film over a semiconductor substrate;

forming a first layer including a layer capable of serving as a conductive layer on the first inter-layer insulating film;

patterning the first layer to form a plurality of first pattern layers including the first layer on the first inter-layer insulating film, where the plurality of first pattern layers are formed to define a regularly arranged first pattern group;

forming a second pattern layer including at least the first layer on the first inter-layer insulating film around the periphery of the first pattern group;

forming a first insulating film on at least the first and second pattern layers;

forming a second layer including a layer capable of serving as a conductive layer on the first insulating film including a space over the first and second pattern layers;

patterning the second layer;

forming a second inter-layer insulating film on the patterned second layer; and planarizing a superficial layer of the second inter-layer insulating film, the step of planarizing removing the superficial layer of the second inter-layer insulating film until a portion of the patterned second layer formed over the second pattern layer is exposed.

14. A method of manufacturing a semiconductor device as set forth in Item 12 or 13, wherein:

the step of planarizing entirely etches at least the superficial layer of the inter-layer insulating film.

15. A method of manufacturing a semiconductor device as set forth in any of Items 12 to 14, wherein:

the second inter-layer insulating film includes one of a BPSG (boro-phospho silicate glass) film and a PSG (phospho-silicate glass) film.

16. A method of manufacturing a semiconductor device as set forth in any of Items 12 to 15, wherein:

the layer capable of serving as the conductive layer is formed of a silicon layer.

I claim:

1. A semiconductor device comprising:

a semiconductor substrate;

a first element forming region and a second element forming region, said first element forming region including a plurality of first element active regions defined by a first element separating structure, each of said first element active regions including a first semiconductor element, said first semiconductor element including at least:
a first insulating film formed on said semiconductor substrate;
a first wire formed on said first insulating film; and
a first source and a first drain, said second element forming region including a plurality of second element active regions defined by a second element separating structure, each of said second element active regions including a second semiconductor element, said second semiconductor element including at least:
a second insulating film formed on said semiconductor substrate;
a second wire formed on said second insulating film; and
a second source and second drain, a pattern layer formed in a boundary zone between said first element forming region and said second element forming region, said pattern layer including a conductive film formed of at least one layer; and an inter-layer insulating film formed over said semiconductor substrate including said first and second semiconductor elements, said inter-layer insulating film including a sloping area in said boundary zone, said conductive film of said pattern layer having a portion exposed from said inter-layer insulating film in said sloping area of said inter-layer insulating film.

2. A semiconductor device according to claim 1, further comprising:

a wiring layer formed on said inter-layer insulating film, said wiring layer electrically connected to said at least one layer of conductive film of said pattern layer.

3. A semiconductor device according to claim 1, wherein:

each of said plurality of first semiconductor elements comprises a capacitor, said capacitor including a lower electrode electrically connected to one of said first source and said first drain, a dielectric film formed on said lower electrode, and an upper electrode.

4. A semiconductor device according to claim 1, wherein:

said inter-layer insulating film includes one of a BPSG (boro-phospho silicate glass) film and a PSG (phospho-silicate glass) film.

5. A semiconductor device according to claim 3, wherein:

said pattern layer formed at the same hierarchical level as said plurality of lower electrodes is formed in substantially the same pattern.

6. A semiconductor device according to claim 3, wherein:

said pattern layer comprises a first dummy pattern layer including a first conductive film formed at the same hierarchical level as said lower electrodes, and a second dummy pattern layer including a second conductive film formed at the same hierarchical level as said upper electrodes.

7. A semiconductor device according to claim 3, wherein:

said pattern layer includes a first dummy pattern film including a conductive film formed at the same hierarchical level as said upper electrodes, said upper electrodes are connected with said first dummy pattern layer, a portion of said dummy pattern film is exposed in said sloping area of said inter-layer insulating film, a wiring layer is formed on said inter-layer insulating film, and said wiring layer is connected to an exposed portion of said first dummy pattern film.

8. A semiconductor device according to claim 1, wherein:

each of said plurality of first semiconductor elements has:
a floating gate formed of said first wire; and
a control gate formed over said floating gate through a third insulating film.

9. A semiconductor device according to claim 1, further comprising a wiring layer formed on said inter-layer insulating film, said pattern layer and said wiring layer being connected in said sloping layer.

10. A semiconductor device according to claim 3, wherein:

said upper electrodes are electrically connected to said pattern layer, and further comprising potential clamping means for clamping said upper electrodes and said pattern layer at a predetermined potential.

11. A semiconductor device according to claim 1, wherein:

said pattern layer includes a first dummy pattern film formed at the same hierarchical level as said first element separating structure.

12. A semiconductor device according to claim 3, wherein:

said lower electrodes comprise a plurality of pattern layers formed around the periphery of a lower electrode group including a plurality of lower electrodes, and at least one of said pattern layers has a portion exposed in said sloping area.

13. A semiconductor device according to claim 3, wherein:

said first and second element separating structures each comprise either of the following element separating structures (a), (b):
(a) a field shield element separating structure comprising a third insulating film formed on said semiconductor substrate, an electrode formed on said third insulating film, and a fourth insulating film formed on said electrode; and
(b) an element separating structure comprising an insulating material formed on said semiconductor substrate.

14. A semiconductor device according to claim 13, wherein:

said semiconductor device includes a first dummy pattern formed at the same hierarchical level as said first element separating structure, and a second dummy pattern having at least one of a first conductive film formed at the same hierarchical level as said lower electrodes and a second conductive film formed at the same hierarchical level as said upper electrodes, and any of said first and second dummy patterns located at a lower layer has its end positioned closer to said second element forming region.

15. A semiconductor device according to claim 1, further comprising:

draw-out electrodes each electrically connected to said first source, said first drain, said second source, and said second drain; and said pattern layer including a conductive film formed at the same hierarchical level as said draw-out electrodes.

16. A semiconductor device having a first region and a second region comprising:

a semiconductor substrate;

a first conductive layer formed in a boundary zone between said first region and said second region over said semiconductor substrate through a first insulating layer;

a second insulating layer formed over said semiconductor substrate, said second insulating layer having a sloping area in said boundary zone between said first and second regions; and said conductive layer partially protruding from a surface of said second insulating layer in said sloping area.

17. A semiconductor device according to claim 16, further comprising:

a wiring layer formed on said second insulating layer, said wiring layer being electrically connected to said conductive layer.

18. A semiconductor device according to claim 1, wherein:

said semiconductor device is formed such that a thickness of said substrate in said first element active region is different from a thickness of said substrate in said second element active region.

19. A semiconductor device according to claim 1, wherein:

a thickness of said substrate in said first element active region is formed thinner than a thickness of said substrate in said second element active region.

20. A semiconductor device comprising:

a semiconductor substrate;

a plurality of element active regions defined by at least an element separating structure, each of said element active regions including a semiconductor element, said semiconductor element having at least:
a first insulating layer formed on said semiconductor substrate;
a first wire formed on said first insulating layer; and
a source and a drain;

a first inter-layer insulating layer formed over said semiconductor substrate;

a first contact hole formed through said first inter-layer insulating film on at least one of regions of said source and said drain of each of said semiconductor elements;

a first conductive pattern layer formed on said first inter-layer insulating film, and formed for each of said first contact holes, said first conductive pattern layer covering inner surfaces of said first contact holes;

a first pattern layer group including said first conductive pattern layer; and a second conductive pattern layer formed on said first inter-layer insulating film and formed in substantially the same pattern as said first conductive pattern layer, a plurality of said second conductive pattern layers being formed on said first inter-layer insulating film, said plurality of second conductive pattern layers being arranged to surround the periphery of said first pattern group.

21. A semiconductor device comprising:

a semiconductor substrate;

a first inter-layer insulating film formed over said semiconductor substrate;

a conductive pattern layer formed on said first inter-layer insulating film;

a second inter-layer insulating film formed on said conductive pattern layer and on said first inter-layer insulating film, said second inter-layer insulating film including a sloping area; and at least a portion of said conductive pattern layer having an end portion exposed in said sloping area of said second inter-layer insulating film.

22. A semiconductor device according to claim 1, wherein:

one of said first element forming region and said second element forming region is a memory cell forming region, and the other region is a peripheral transistor forming region.

* * * * *